US012765267B2

(12) United States Patent
Seo

(10) Patent No.: US 12,765,267 B2
(45) Date of Patent: Oct. 13, 2026

(54) SEMICONDUCTOR DEVICE INCLUDING MAGNETIC TUNNEL JUNCTION STRUCTURE

(71) Applicant: SK hynix Inc., Icheon-si (KR)

(72) Inventor: Soo Man Seo, Icheon-si (KR)

(73) Assignee: SK HYINX INC., Icheon-si (KR)

( * ) Notice: Subject to any disclaimer, the term of this patent is extended or adjusted under 35 U.S.C. 154(b) by 184 days.

(21) Appl. No.: 18/538,378

(22) Filed: Dec. 13, 2023

(65) Prior Publication Data

US 2025/0008843 A1 Jan. 2, 2025

(30) Foreign Application Priority Data

Jun. 29, 2023 (KR) ........................ 10-2023-0084132

(51) Int. Cl.

*H10N 50/20* (2023.01)
*H01F 10/32* (2006.01)
*H10B 61/00* (2023.01)

(52) U.S. Cl.

CPC ......... *H10N 50/20* (2023.02); *H01F 10/3272* (2013.01); *H01F 10/3286* (2013.01); *H10B 61/00* (2023.02); *H01F 10/3254* (2013.01); *H01F 10/329* (2013.01)

(58) Field of Classification Search

CPC ............. H01F 10/3254; H01F 10/3272; H01F 10/3276; H01F 10/329; H10B 61/00; H10N 50/20

See application file for complete search history.

(56) References Cited

U.S. PATENT DOCUMENTS 8,729,647 B2 * 5/2014 Lee ........................ H10N 50/10 365/158
10,008,248 B2 6/2018 Buhrman et al.
10,333,058 B2 6/2019 Aradhya et al.
(Continued)

FOREIGN PATENT DOCUMENTS

KR 20200050400 A 5/2020

OTHER PUBLICATIONS

Fan, T. et al. "Ultrahigh efficient spin orbit torque magnetization switching in fully sputtered topological insulator and ferromagnet multilayers." Nature Portfolio, scientific reports; (2022) 12:2998, 8 pages.

*Primary Examiner* — David C Spalla
(74) *Attorney, Agent, or Firm* — Ashurst Perkins Coie US LLP

(57) ABSTRACT

In an embodiment, a semiconductor device includes a spin orbit torque (SOT) line extending in a first direction; an electrode layer spaced apart from the SOT line in a third direction; and a magnetic tunnel junction structure interposed between the SOT line and the electrode layer, and including a free layer adjacent to the SOT line in the third direction, a pinned layer adjacent to the electrode layer in the third direction, and a tunnel barrier layer interposed between the free layer and the pinned layer, wherein the magnetic tunnel junction structure includes a first portion overlapping the SOT line and a second portion not overlapping the SOT line in a second direction, the electrode layer overlaps at least a portion of the second portion, and a thickness of the free layer in the first portion is greater than a thickness of the free layer in the second portion.

20 Claims, 9 Drawing Sheets

(56) References Cited

U.S. PATENT DOCUMENTS

| | | | | |
|---|---|---|---|---|
| 2009/0261434 | A1* | 10/2009 | Kang | H10B 61/00 257/E29.323 |
| 2015/0348606 | A1* | 12/2015 | Buhrman | G11C 16/30 365/158 |
| 2018/0151210 | A1 | 5/2018 | Li et al. | |
| 2019/0244646 | A1* | 8/2019 | Lee | H10N 50/80 |
| 2020/0081078 | A1* | 3/2020 | Katti | G01R 33/091 |

* cited by examiner

SEMICONDUCTOR DEVICE INCLUDING MAGNETIC TUNNEL JUNCTION STRUCTURE

CROSS-REFERENCE TO RELATED APPLICATION

This patent document claims the priority and benefits of Korean Patent Application No. 10-2023-0084132 filed on Jun. 29, 2023, which is incorporated herein by reference in its entirety.

TECHNICAL FIELD

The technology disclosed in this patent document relates to a semiconductor technology, and more particularly, to a semiconductor device including a magnetic tunnel junction structure.

BACKGROUND

The recent trend toward miniaturization, low power consumption, high performance, and multi-functionality in the electrical and electronics industry has compelled the semiconductor manufacturers to focus on, high-performance, high capacity semiconductor devices. Examples of such high-performance, high-capacity semiconductor devices include memory devices that can store data by switching between different resistance states according to an applied voltage or current, such as an RRAM (resistive random access memory), a PRAM (phase change random access memory), an FRAM (ferroelectric random access memory), an MRAM (magnetic random access memory), and an E-electronic fuse (fuse).

SUMMARY

In an embodiment, a semiconductor device may include: one or more first conductive lines extending in a first direction to carry a current through the first conductive line; one or more electrode layers, each electrode layer spaced apart from a corresponding first conductive line in a third direction crossing the first direction; and one or more magnetic tunnel junction structures, each magnetic tunnel junction structure interposed between a corresponding first conductive line and a corresponding electrode layer, each of the one or more magnetic tunnel junction structures including a free layer, a pinned layer, and a tunnel barrier layer stacked in the third direction, the free layer disposed adjacent to the first conductive line arranged, the pinned layer disposed adjacent to the electrode layer, the tunnel barrier layer interposed between the free layer and the pinned layer, wherein each of the magnetic tunnel junction structures includes a first portion that overlaps the first conductive line and a second portion that does not overlap the first conductive line, the magnetic tunnel junction structure extending in a second direction crossing the first and third directions, the electrode layer overlaps at least partially the second portion, and a thickness of the free layer in the first portion is greater than a thickness of the free layer in the second portion.

DETAILED DESCRIPTION

Figure 1A:
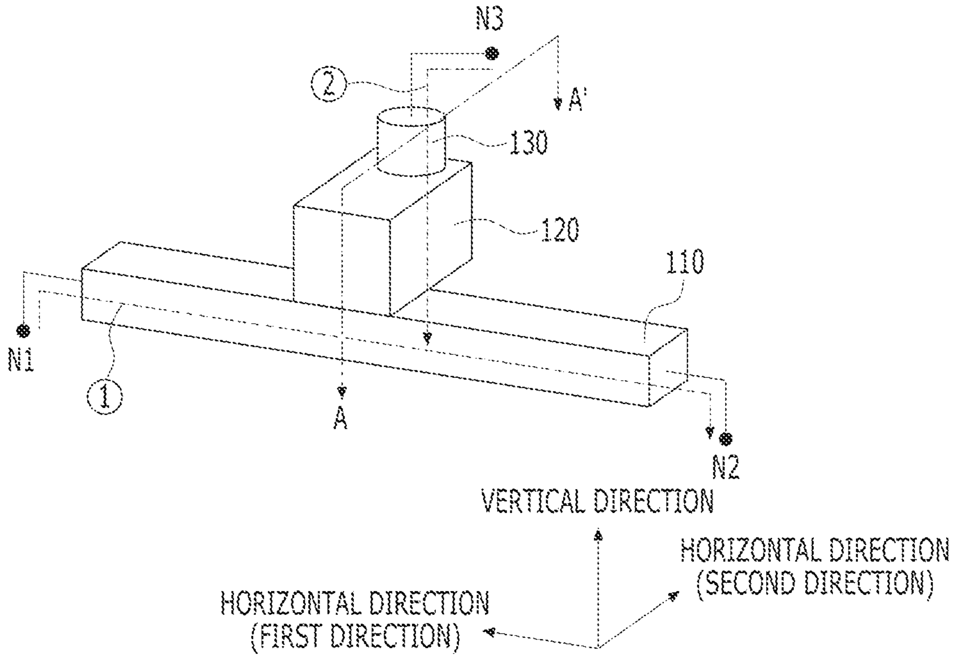
FIGS. 1A and 1B are views illustrating a semiconductor device based on some embodiments of the disclosed technology.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being “on” or “over” a second layer or “on” or “over” a substrate, the first layer may be directly formed on the second layer or the substrate but may also represent a structure where one or more other intermediate layers may exist between the first layer and the second layer or the substrate.

Figure 1B:
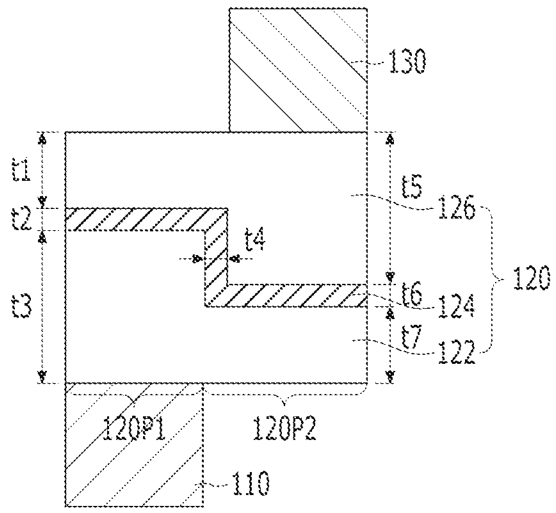

FIGS. 1A and 1B are views illustrating a semiconductor device based on some embodiments of the disclosed technology. FIG. 1A shows a perspective view, and FIG. 1B shows a cross-sectional view taken along a line A-A' of FIG. 1A.

Referring to FIGS. 1A and 1B, a semiconductor device of an embodiment may include a Spin Orbit Torque (SOT) line (or a first conductive line) 110 and an electrode layer 130 that are spaced apart from each other in a vertical direction, and a magnetic tunnel junction (MTJ) structure 120 interposed between the SOT line 110 and the electrode layer 130 and including a free layer 122, a tunnel barrier layer 124, and a pinned layer 126. The free layer 122 may be disposed relatively adjacent to the SOT line 110 and the pinned layer 126 may be disposed relatively adjacent to the electrode layer 130, with the tunnel barrier layer 126 therebetween. In some implementations, the term "SOT line" can be used to indicate a conductive material layer for performing a spin orbit torque (SOT) method as explained below to change a magnetization direction of the free layer 122 within the MTJ structure 120. As an example, as shown, the SOT line 110, the free layer 122, the tunnel barrier layer 124, the pinned layer 126, and the electrode layer 130 may be stacked or arranged sequentially in one direction (e.g., vertical direction). Here, the vertical direction may correspond to the stacking direction of the free layer 122, the tunnel barrier layer 124, and the pinned layer 126. In some implementations, a horizontal direction may be a direction substantially perpendicular to the vertical direction and/or the stacking direction while being substantially parallel to the lower surface of the free layer 122 or the upper surface of the pinned layer 126. The SOT line 110 may extend in a first direction parallel to the horizontal direction. A second direction may be a direction substantially perpendicular to the first direction while being parallel to the horizontal direction.

In the magnetic tunnel junction structure 120, the free layer 122 may be a layer that stores different data by having a variable magnetization direction, and may also be called a storage layer. The pinned layer 126 may be a layer that has a fixed magnetization direction, different from the magnetization direction of the free layer 122. In some implementations, the pinned layer 126 may be referred to as a reference layer. Each of the free layer 122 and the pinned layer 126 may have a magnetization direction substantially parallel to the vertical direction, or may have a magnetization direction substantially parallel to the horizontal direction. The tunnel barrier layer 124 may physically separate the pinned layer 126 and the free layer 122 from each other, and may enable tunneling of electrons between the pinned layer 126 and the free layer 122.

The magnetic tunnel junction structure 120 may store different data bits by switching between different resistance states depending on the applied voltage or current. In some implementations, when the magnetization direction of the free layer 122 changes depending on the voltage or current applied to the magnetic tunnel junction structure 120 and becomes parallel to the magnetization direction of the pinned layer 126, the magnetic tunnel junction structure 120 may have a low resistance state, and, for example, may store data bit "1." On the other hand, when the magnetization direction of the free layer 122 changes depending on the voltage or current applied to the magnetic tunnel junction structure 120 and becomes anti-parallel to the magnetization direction of the pinned layer 126, the magnetic tunnel junction structure 120 may have a high resistance state, and, for example, may store data bit "0." In an embodiment, the magnetization direction of the free layer 122 of the magnetic tunnel junction structure 120 may be changed by the voltage or current applied through the SOT line 110 and the electrode layer 130, as will be discussed below.

In the magnetic tunnel junction structure 120, each of the free layer 122 and the pinned layer 126 may include a single-layer structure or a multi-layer structure including a ferromagnetic material. As an example, either or each of the free layer 122 and the pinned layer 126 may include an alloy containing Fe, Ni, or Co as a main component, for example, at least one of Fe—Pt alloy, Fe—Pd alloy, Co—Pd alloy, Co—Pt alloy, Fe—Ni—Pt alloy, Co—Fe—Pt alloy, Co—Ni—Pt alloy, or Co—Fe—B alloy, or, a laminated structure such as Co/Pt or Co/Pd. The tunnel barrier layer 124 may have a single-layer or a multi-layer structure including an insulating material. As an example, the tunnel barrier layer 124 may include an insulating oxide such as MgO, CaO, SrO, TiO, VO, or NbO. The magnetic tunnel junction structure 120 may have a pillar shape. Furthermore, the magnetic tunnel junction structure 120 may have a pillar shape in which its length in the first direction is smaller than its length in the second direction. In an embodiment, the magnetic tunnel junction structure 120 may have a rectangular shape in a plan view, but the disclosed technology is not limited thereto, and the planar shape of the magnetic tunnel junction structure 120 may be modified in various ways.

The SOT line 110 may be adjacent to the free layer 122 of the magnetic tunnel junction structure 120 in the vertical direction, and may function to change the magnetization direction of the free layer 122 by an SOT method. In other words, the magnetization direction of the free layer 122 may be changed under the influence of the spin current generated by the strong spin-orbit coupling force, which is generated by the current flowing through the SOT line 110 (see dotted arrow ① in FIG. 1A). A material with the string-orbit coupling force may have a high charge-current to spin-current conversion efficiency, that is, a high spin hall effect. The SOT line 110 may have a single-layer structure or a multi-layer structure that includes one or more various conductive materials. As an example, the SOT line 110 may include a heavy metal such as α-W, β-W, Mo, Ru, β-Ta, or a combination thereof, or an anti-ferromagnetic material such as IrMn, to create the strong spin-orbit interaction with the changeable magnetization of the free layer 122 while the magnetization direction of the pinned layer 126 is fixed and not changed.

The SOT line 110 may have a line shape extending in the first direction, and may overlap and be connected to a portion of the magnetic tunnel junction structure 120 under the magnetic tunnel junction structure 120. The SOT line 110 may be in a direct contact with a portion of the lower surface of the free layer 122. Because the SOT line 110 overlaps a portion of the magnetic tunnel junction structure 120, a remaining portion of the magnetic tunnel junction structure 120 may protrude from the SOT line 110 in the second direction. A portion of the magnetic tunnel junction structure 120 that overlaps the SOT line 110 may be referred to as a first portion 120P1, and a remaining portion of the SOT line 110, except for the first portion 120P1, may be referred to as a second portion 120P2.

The electrode layer 130 may be located at the opposite side of the SOT line 110 in the vertical direction with the magnetic tunnel junction structure 120 interposed therebetween, and accordingly, the electrode layer 130 may be adjacent to the pinned layer 126 in the vertical direction. The electrode layer 130 may function to change the magnetization direction of the free layer 122 using a spin transfer torque (STT) method. In other words, spin-polarized charge carriers resulting from a current flowing through the magnetic tunnel junction structure 120 in the vertical direction (see dotted arrow ② in FIG. 1A) from the electrode layer 130 may be injected into the free layer 122, and thus, the magnetization of the free layer 122 may be changed. The electrode layer 130 may have a single-layer structure or a multi-layer structure containing at least one of various conductive materials. As an example, the electrode layer 130 may include a metal such as platinum (Pt), tungsten (W), aluminum (Al), copper (Cu), titanium (Ti), or tantalum (Ta), a metal nitride such as titanium nitride (TiN) or tantalum nitride (TaN), or a combination thereof.

The electrode layer 130 may have a pillar shape, and may overlap and be connected to at least a portion of the second portion 120P2 of the magnetic tunnel junction structure 120 over the magnetic tunnel junction structure 120. Accordingly, the electrode layer 130 may be disposed in an off-pitch with the SOT line 110 in the second direction. In an embodiment, the electrode layer 130 is in direct contact with a portion of the upper surface of the pinned layer 126, but the disclosed technology is not limited thereto. In another embodiment, a conductive layer (not shown) may be interposed between the electrode layer 130 and the pinned layer 126, and in this case, the electrode layer 130 and the pinned layer 126 may be electrically connected with each other through the conductive layer. In an embodiment, the case where the electrode layer 130 has a circular shape in a plan view is shown, but the disclosed technology is not limited thereto, and the planar shape of the electrode layer 130 may be modified in various ways. Additionally, in an embodiment, the electrode layer 130 has a width smaller than a width of the second portion 120P2 in each of the first direction and the second direction so that the planar area of the electrode layer 130 is smaller than the planar area of the second portion 120P2, but the disclosed technology is not limited thereto, and the planar area of the electrode layer 130 may be modified in various ways on the premise that the planar area of the electrode layer 130 is less than or equal to the planar area of the second portion 120P2. For example, in another embodiment, the shape and area of the electrode layer 130 in a plan view may be substantially the same as the shape and area of the second portion 120P2.

In such a semiconductor device, each of the thickness of the free layer 122 and the thickness of the pinned layer 126 may not be constant, and may vary depending on the location. More specifically, the thickness t3 of the free layer 122 in the first portion 120P1 overlapping the SOT line 110 may be greater than the thickness t7 of the free layer 122 in the second portion 120P2 overlapping the electrode layer 130, and the thickness t1 of the pinned layer 126 in the first portion 120P1 may be smaller than the thickness t5 of the pinned layer 126 in the second portion 120P2. Additionally, the thickness t3 may be greater than the thickness t1, and the thickness t7 may be smaller than the thickness t5. Furthermore, the thickness t1 and the thickness t7 may be substantially the same as each other, and the thickness t3 and the thickness t5 may be substantially the same as each other. Here, when the deviation between two different values such as thickness values is within 10% of the values, it can be said that those two different values are substantially same. For example, the thickness t1 may have a value of 90% to 110% of the thickness t7, and the thickness t3 may have a value of 90% to 110% of the thickness t5. Because of the difference in thickness, when the lower surface of the free layer 122 is located at substantially the same height in the vertical direction, the height of the upper surface of the free layer 122 may be variable its location. That is, the height of the upper surface of the free layer 122 in the first portion 120P1 may be greater than the height of the upper surface of the free layer 122 in the second portion 120P2. The upper surface of the free layer 122 in each of the first portion 120P1 and the second portion 120P2 may be substantially parallel to the horizontal direction, and the upper surface of the free layer 122 at the boundary between the first portion 120P1 and the second portion 120P2 may be substantially parallel to the vertical direction while connecting the upper surface of the free layer 122 in the first portion 120P1 and the upper surface of the free layer 122 in the second portion 120P2 to each other. Additionally, because of the difference in thickness, when the upper surface of the pinned layer 126 is located at substantially the same height in the vertical direction, the height of the lower surface of the pinned layer 126 may vary depending on its location. That is, the height of the lower surface of the pinned layer 126 in the first portion 120P1 may be greater than the height of the lower surface of the pinned layer 126 in the second portion 120P2. The lower surface of the pinned layer 126 in each of the first portion 120P1 and the second portion 120P2 may be substantially parallel to the horizontal direction, and the lower surface of the pinned layer 126 at the boundary between the first portion 120P1 and the second portion 120P2 may be substantially parallel to the vertical direction while connecting the lower surface of the pinned layer 126 in the first portion 120P1 and the lower surface of the pinned layer 126 in the second portion 120P2 to each other. In some implementations, the thickness of the tunnel barrier layer 124 may be substantially constant regardless of its location. That is, the thickness t2 of the tunnel barrier layer 124 in the first portion 120P1, the thickness t6 of the tunnel barrier layer 124 in the second portion 120P2, and the thickness t4 of the tunnel barrier layer 124 at the boundary between the first portion 120P1 and the second portion 120P2 may be substantially the same as each other. For example, either or each of the thickness t4 and the thickness t6 may have a value of 90% to 110% of the thickness t2. The sum of the thickness t1 of the pinned layer 126, the thickness t2 of the tunnel barrier layer 124, and the thickness t3 of the free layer 122 in the first portion 120P1 may be substantially equal to the sum of the thickness t5 of the pinned layer 126, the thickness t6 of the tunnel barrier layer 124, and the thickness t7 of the free layer 122 in the second portion 120P2.

In general, when a free layer in a magnetic tunnel junction structure has a perpendicular magnetization direction, a perpendicular magnetic anisotropy of the free layer may be inversely proportional to the thickness of the free layer. That is, as the thickness of the free layer increases, the perpendicular magnetic anisotropy may decrease, and as the thickness of the free layer decreases, the perpendicular magnetic anisotropy may increase. When the thickness of the free layer decreases and the perpendicular magnetic anisotropy increases accordingly, it becomes difficult to switch the magnetization direction of the free layer, resulting in a decrease in operation speed and a problem of high power consumption. On the other hand, when the thickness of the free layer increases and the perpendicular magnetic anisotropy decreases accordingly, the thermal stability may be deteriorated. In order to address this issue, in an embodiment, the thickness t3 of the free layer 122 in the first portion 120P1 overlapping the SOT line 110 may be relatively large, and thus, switching of the magnetization direction of the free layer 122 by the SOT method may be facilitated. In addition, thermal stability may be ensured by reducing the thickness t7 of the free layer 122 in the second portion 120P2 that does not overlap the SOT line 110.

However, since the thickness t7 of the free layer 122 in the second portion 120P2 is thinner than other areas of the free layer 122, the spin current generated by the SOT line 110 alone may be insufficient for switching the magnetization direction of the free layer 122. The disclosed technology can be implemented in some embodiments to address this issue by facilitating switching of the magnetization direction of the free layer 122. In some embodiments, an STT method may be used to facilitate switching of the magnetization direction of the free layer 122 by disposing the electrode layer 130 overlapping the second portion 120P2.

As a result, switching of the magnetization direction of the free layer 122 may occur simultaneously using an SOT method that uses a horizontal current and an STT method that uses a vertical current, so that a semiconductor device can perform high-speed and low-power operation and ensures thermal stability.

The operation of the semiconductor device described above will be described with reference to FIGS. 2A to 2C and FIGS. 3A and 3B.

Figure 2A:
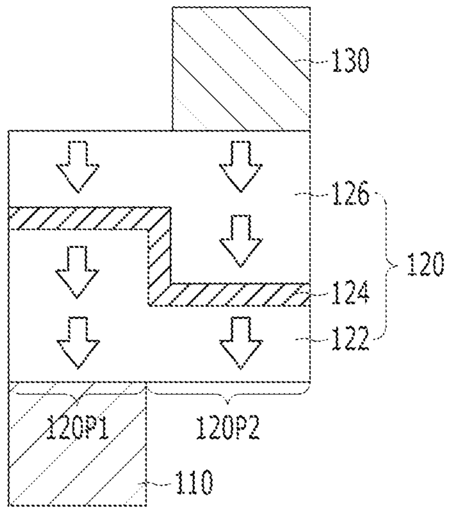
FIGS. 2A to 2C are cross-sectional views showing states of a semiconductor device based on some embodiments of the disclosed technology.
Figure 2B:
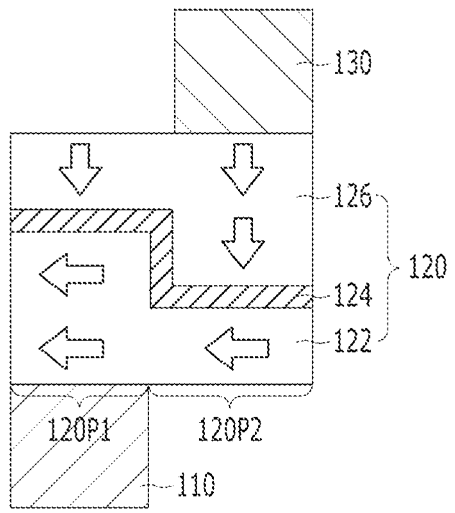
Figure 2C:
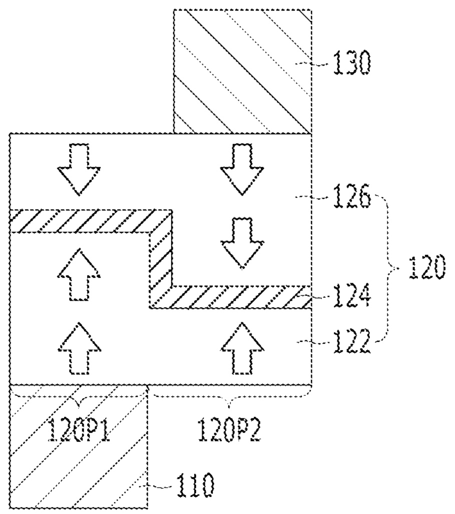
Figure 3A:
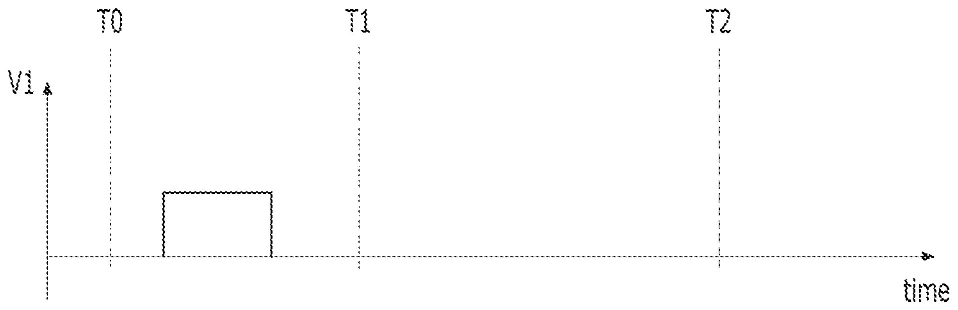
FIGS. 3A and 3B are voltage-time graphs illustrating an example of an operation of a semiconductor device based on some embodiments of the disclosed technology.
Figure 3B:
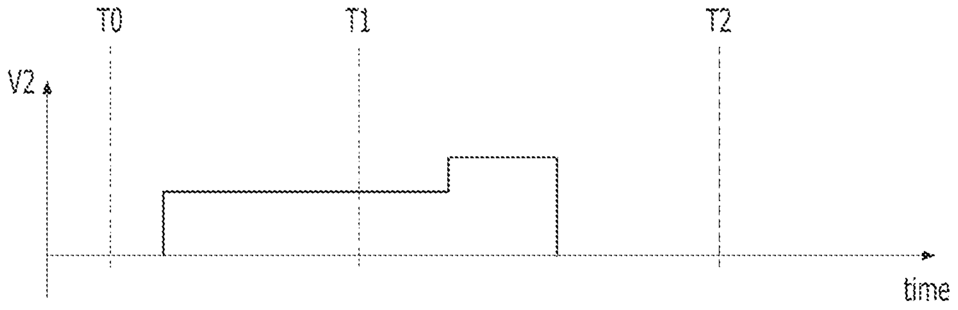

FIGS. 2A to 2C are cross-sectional views showing states of a semiconductor device based on some embodiments of the disclosed technology, and FIGS. 3A and 3B are voltage-time graphs illustrating an example of an operation of a semiconductor device based on some embodiments of the disclosed technology. FIGS. 2A, 2B, and 2C show the states at time T0, time T1, and time T2 in FIGS. 3A and 3B, respectively. FIG. 3A shows a voltage applied between a first node N1 and a second node N2 of the SOT line 110 of FIG. 1A, and FIG. 3B shows a voltage applied to a third node N3 of the electrode layer 130 of FIG. 1A.

Referring to FIGS. 3A and 3B, in the initial state, that is, at the time T0, the magnetic tunnel junction structure 120 may have the state illustrated in FIG. 2A or the state of FIG. 2C. Referring to FIG. 2A, the magnetization direction of the free layer 122 and the magnetization direction of the pinned layer 126 may be parallel to each other, and accordingly, the magnetic tunnel junction structure 120 may have a low resistance state. On the other hand, referring to FIG. 2C, the magnetization direction of the free layer 122 and the magnetization direction of the pinned layer 126 may be anti-parallel to each other, and accordingly, the magnetic tunnel junction structure 120 may have a high resistance state. In an embodiment, the free layer 122 and the pinned layer 126 may have a perpendicular magnetization direction as indicated by arrows shown in FIGS. 2A, 2B, and 2C. As an example, the pinned layer 126 may have a magnetization direction from top to bottom, and the free layer 122 may have one of a magnetization direction from top to bottom or a magnetization direction from bottom to top.

Subsequently, in the time period between the time T0 and the time T1, a first voltage V1 may be applied through the first node N1 and the second node N2 to change the resistance state of the magnetic tunnel junction structure 120. The first voltage V1 may be for SOT-type magnetization direction switching. Furthermore, a second voltage V2 may be applied through the third node N3 in this time period. The second voltage V2 may be for STT-type magnetization direction switching. The second voltage V2 may be optionally applied in this time period. That is, in an embodiment, it is shown that the second voltage V2 of a predetermined magnitude is applied in this time period, but the disclosed technology is not limited thereto. In another embodiment, the second voltage V2 may not be applied in this time period, or the magnitude of the second voltage V2 may be 0.

After the first voltage V1 is applied, at the time T1, the magnetic tunnel junction structure 120 may have the state of FIG. 2B. In FIG. 2B, the magnetization direction of the free layer 122 is indicated by a horizontal arrow. This may indicate that the magnetization direction of the free layer 122 is not parallel or anti-parallel to the magnetization direction of the pinned layer 126, which has a perpendicular magnetization direction, and accordingly, the magnetization direction switching of the free layer 122 is insufficient.

In order to compensate for the switching of the magnetization direction of the free layer 122, the magnitude of the second voltage V2 applied through the third node N3 in the time period between the time T1 and the time T2 may be increased. The magnitude of the second voltage V2 applied in the time period between the time T0 and the time T1 may be 0 or more, and may be smaller than the magnitude of the second voltage V2 applied in the time period between the time T1 and the time T2.

After the second voltage V2 is applied, at the time T2, the magnetic tunnel junction structure 120 may have the state of FIG. 2C or the state of FIG. 2A. If the magnetic tunnel junction structure 120 has the state of FIG. 2A at the time T0, the magnetic tunnel junction structure 120 may have the state of FIG. 2C at the time T2. Conversely, if the magnetic tunnel junction structure 120 has the state of FIG. 2C at the time T0, the magnetic tunnel junction structure 120 may have the state of FIG. 2A at the time T2.

In this way, resistance state switching of the magnetic tunnel junction structure 120 may be performed.

In some embodiments, as long as the magnetic tunnel junction structure 120 includes the free layer 122, the pinned layer 126, and the tunnel barrier layer 124 therebetween, the layer structure of the magnetic tunnel junction structure 120 may be modified in various ways. As an example, the vertical positions of the pinned layer 126 and the free layer 122 may be reversed with each other. However, in this case, the SOT line 110 may need to be closer to the free layer 122 than the pinned layer 126 for the SOT switching. Therefore, the vertical positions of the SOT line 110 and the electrode layer 130 may also be reversed with each other. This will be exemplarily described with reference to FIG. 4. Alternatively, as an example, the magnetic tunnel junction structure 120 may further include one or more layers to improve its properties. For example, the magnetic tunnel junction structure 120 may include another pinned layer that is anti-ferromagnetically coupled to the pinned layer 126 to form a synthetic anti-ferromagnetic (SAF) structure to strengthen the fixation of the magnetization direction of the pinned layer 126. This will be exemplarily described with reference to FIG. 5. Alternatively, for example, the magnetic tunnel junction structure 120 may further include one or more conductive layers interposed between the pinned layer 126 and the electrode layer 130. This conductive layer may be referred to as an electrode layer, a hard mask layer, a capping layer, or the like, depending on its function.

Figure 4:
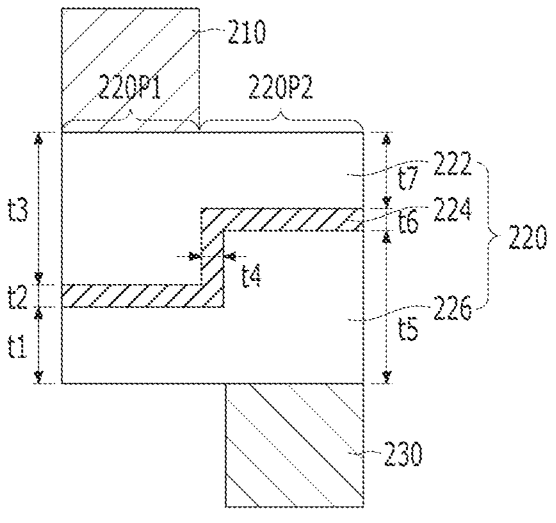
FIG. 4 is a cross-sectional view illustrating a semiconductor device based on some embodiments of the disclosed technology.

FIG. 4 is a cross-sectional view illustrating a semiconductor device based on some embodiments of the disclosed technology. The description will focus on the differences from the semiconductor device of FIGS. 1A and 1B.

Referring to FIG. 4, a semiconductor device of an embodiment may include an electrode layer 230, a magnetic tunnel junction structure 220 including a pinned layer 226, a tunnel barrier layer 224, and a free layer 222, and an SOT line 210 that are arranged from bottom to top.

The thickness t3 of the free layer 222 in the first portion 220P1 overlapping the SOT line 210 may be greater than the thickness t7 of the free layer 222 in the second portion 220P2 overlapping the electrode layer 230. Furthermore, the thickness t1 of the pinned layer 226 in the first portion 220P1 may be smaller than the thickness t5 of the pinned layer 226 in the second portion 220P2. The thicknesses t2, t4, and t6 of the tunnel barrier layer 224 may be substantially constant.

In some implementations, the magnetic tunnel junction structure 220 in an embodiment may include the pinned layer 226 disposed below the tunnel barrier layer 224 and the free layer 222 disposed above the tunnel barrier layer 224.

The electrode layer 230 may be disposed below the magnetic tunnel junction structure 220, and the SOT line 210 may be disposed above the magnetic tunnel junction structure 220.

As will be discussed below, the SOT line and the free layer are located relatively below the pinned layer and the electrode layer, and the pinned layer and the electrode layer are located relatively above the SOT line and the free layer, similar to FIGS. 1A and 1B. However, the disclosed technology is not limited thereto, and in the semiconductor devices in some embodiments as will be discussed below, the vertical positions of the SOT line and the free layer, and the vertical positions of the pinned layer and the electrode layer may be modified, similar to FIG. 4.

Figure 5:
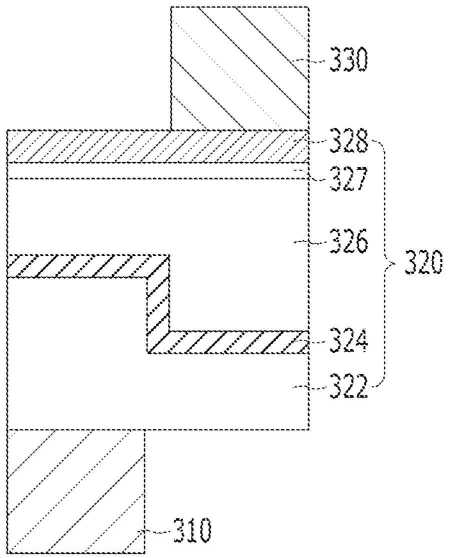
FIG. 5 is a cross-sectional view illustrating a semiconductor device based on some embodiments of the disclosed technology.

FIG. 5 is a cross-sectional view illustrating a semiconductor device based on some embodiments of the disclosed technology. The description will focus on the differences from the semiconductor device of FIGS. 1A and 1B.

Referring to FIG. 5, a semiconductor device of an embodiment may include an SOT line 310, a magnetic tunnel junction structure 320 including a free layer 322, a tunnel barrier layer 324, and a pinned layer 326, and an electrode layer 330. Furthermore, the magnetic tunnel junction structure 320 may further include an additional pinned layer 328 interposed between the pinned layer 326 and the electrode layer 330.

The additional pinned layer 328 may be anti-ferromagnetically coupled to the pinned layer 326 to form an SAF structure, thereby strengthening the magnetization direction of the pinned layer 326. An SAF coupling pattern 327 containing a non-magnetic material may be interposed between the additional pinned layer 328 and the pinned layer 326. In an embodiment, only one additional pinned layer 328 is added, but the disclosed technology is not limited thereto. Two or more additional pinned layers may be interposed between the pinned layer 326 and the electrode layer 330, and an SAF coupling pattern may be interposed between adjacent additional pinned layers.

The additional pinned layer 328 and the SAF coupling pattern 327 may be part of the magnetic tunnel junction structure 320, and may be patterned together with the free layer 322, the tunnel barrier layer 324, and the pinned layer 326. Therefore, the sidewalls of the additional pinned layer 328 and the SAF coupling pattern 327 may be aligned with the sidewalls of the free layer 322, the tunnel barrier layer 324, and the pinned layer 326.

In some implementations, in the semiconductor device of FIGS. 1A and 1B, the case where one SOT line 110 is connected to one magnetic tunnel junction structure 120 and one electrode layer 330 has been described, but the disclosed technology is not limited thereto. In another embodiment, one SOT line may be connected to a plurality of magnetic tunnel junction structures and a plurality of electrode layers respectively corresponding to the plurality of magnetic tunnel junction structures. Furthermore, a plurality of SOT lines may be arranged, and each of the plurality of SOT lines may be connected to one or more magnetic tunnel junction structures and one or more electrode layers respectively corresponding to the one or more magnetic tunnel junction structures. This will be described exemplarily with reference to FIGS. 6A to 6C.

Figure 6A:
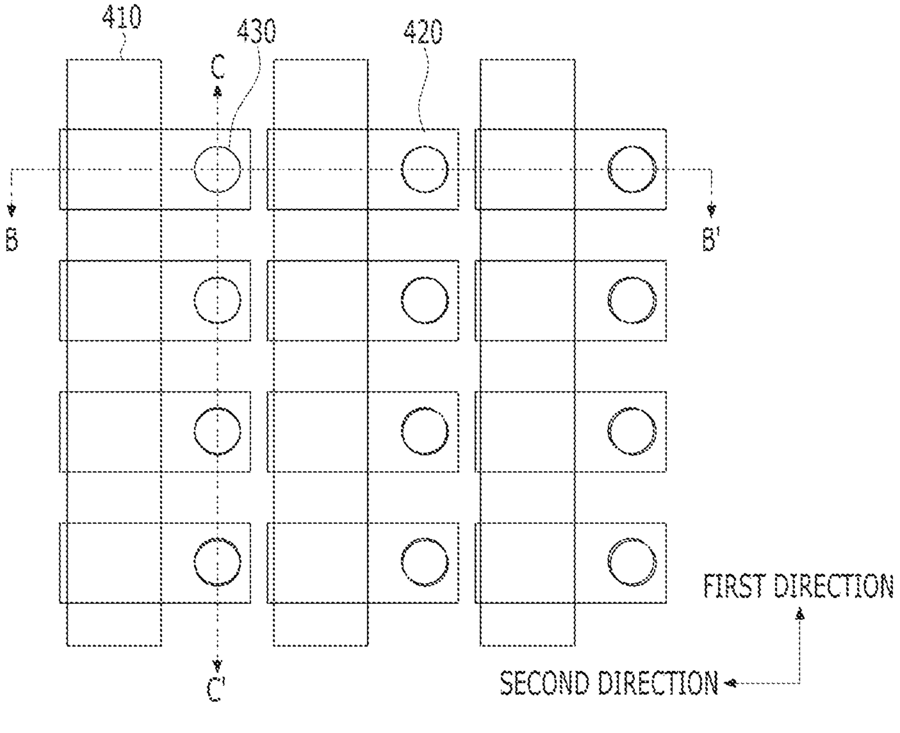
FIGS. 6A to 6C are views illustrating a semiconductor device based on some embodiments of the disclosed technology.
Figure 6B:
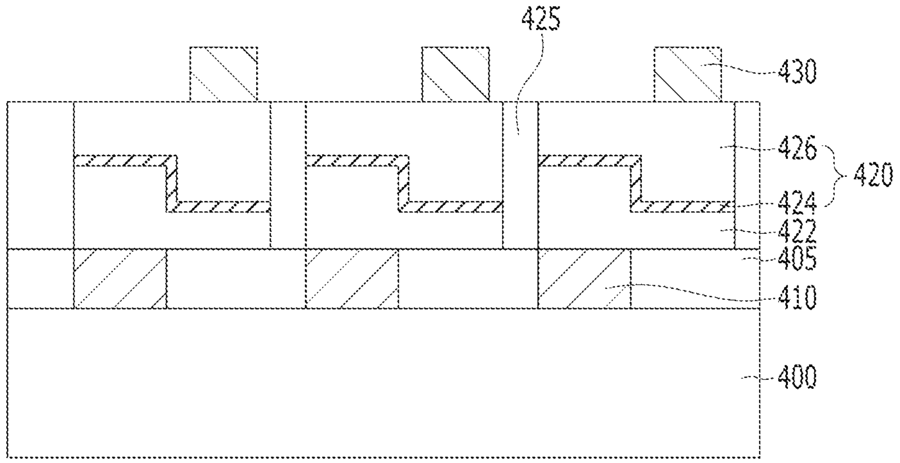
Figure 6C:
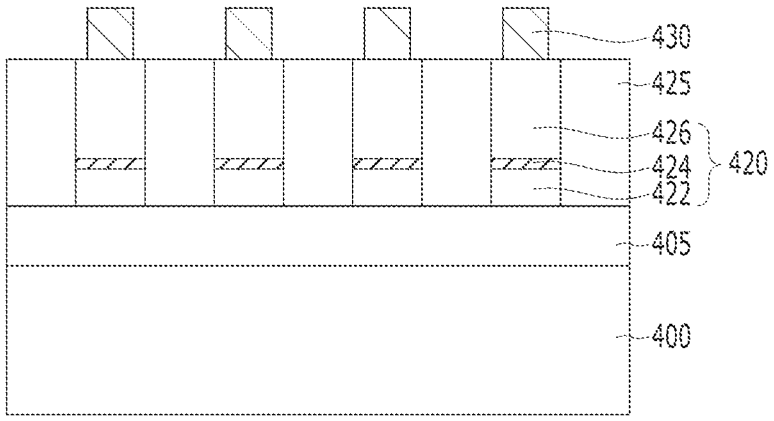

FIGS. 6A to 6C are views illustrating a semiconductor device based on some embodiments of the disclosed technology. FIG. 6A is a plan view, FIG. 6B is a cross-sectional view taken along a line B-B' of FIG. 6A, and FIG. 6C is a cross-sectional view taken along a line C-C' of FIG. 6A. The description will focus on the differences from the semiconductor device of FIGS. 1A and 1B.

Referring to FIGS. 6A to 6C, a semiconductor device of an embodiment may include a substrate 400, a plurality of SOT lines 410 disposed over the substrate 400, a plurality of magnetic tunnel junction structures 420 disposed over the plurality of SOT lines 410, and a plurality of electrode layers 430 disposed over the plurality of magnetic tunnel junction structures 420.

The substrate 400 may include a semiconductor material such as silicon. Additionally, the substrate 400 may include a required substructure (not shown). As an example, the substrate 400 may include a driving circuit that is connected to the SOT line 410 and/or the electrode layer 430 for driving them.

The plurality of SOT lines 410 may extend in the first direction over the substrate 400, and may be arranged to be spaced apart from each other in the second direction. The space between the plurality of SOT lines 410 may be filled with a first interlayer insulating layer 405. The first interlayer insulating layer 405 may include an insulating material such as silicon oxide, silicon nitride, silicon oxynitride, or a combination thereof.

The SOT line 410 and the first interlayer insulating layer 405 may be formed in the following manner. As an example, the SOT lines 410 and the first interlayer insulating layer 405 may be formed by depositing a conductive material for forming the SOT line 410 over the substrate 400, selectively etching the conductive material to form the SOT lines 410, depositing an insulating material thick enough to cover the SOT lines while filling the spaces between the SOT lines 410, and performing a planarization process such as chemical mechanical polishing (CMP) to expose the upper surfaces of the SOT lines 410. As another example, the SOT lines 410 and the first interlayer insulating layer 405 may be formed by depositing an insulating material for forming the first interlayer insulating layer 405 over the substrate 400, selectively etching the insulating material to form the first interlayer insulating layer 405 that provides spaces for the SOT lines 410 to be formed, depositing a conductive material thick enough to cover the first interlayer insulating layer 405 while filling the spaces, and performing a planarization process to expose the upper surface of the first interlayer insulating layer 405.

The plurality of magnetic tunnel junction structures 420 arranged in the first direction may overlap each SOT line 410. Since the plurality of SOT lines 410 are arranged in the second direction, the plurality of magnetic tunnel junction structures 420 may be arranged in a matrix form along the first and second directions. Each of the plurality of magnetic tunnel junction structures 420 may have a pillar shape, and may be spaced apart from each other in the first direction and the second direction. Each of the plurality of magnetic tunnel junction structures 420 may have a portion that overlaps the corresponding SOT line 410 and a remaining portion that does not overlap the corresponding SOT line 410 and protrudes from the corresponding SOT line 410 to one side in the second direction, for example, to the right.

Each of the plurality of magnetic tunnel junction structures 420 may include a free layer 422, a tunnel barrier layer 424, and a pinned layer 426. Here, the thickness of the portion of the free layer 422 that overlaps the corresponding SOT line 410 may be greater than the thickness of the remaining portion of the free layer 422 protruding from the corresponding SOT line 410. Additionally, the thickness of the portion of the pinned layer 426 that overlaps the corresponding SOT line 410 may be smaller than the thickness of the remaining portion of the pinned layer 426 protruding from the corresponding SOT line 410.

The magnetic tunnel junction structures 420 may be formed in the following manner. First, a first magnetic material for forming the free layer 422 may be deposited over the SOT lines 410 and the first interlayer insulating layer 405, and then, the first magnetic material in the area that does not overlap the SOT line 410 may be selectively etched to a predetermined thickness. Here, a mask used for selective etching of the first magnetic material may have a shape that covers the area overlapping the SOT line 410 and exposes the remaining area. Subsequently, an insulating material for forming the tunnel barrier layer 424 may be deposited conformally along the lower profile over the etched first magnetic material. Subsequently, a second magnetic material for forming the pinned layer 426 may be formed over the insulating material, and then, a planarization process may be performed on the second magnetic material. Subsequently, the stacked structure of the first magnetic material, the insulating material, and the second magnetic material may be selectively etched so that it has a pillar shape. As a result, the magnetic tunnel junction structure 420 as shown may be formed.

The space between the plurality of magnetic tunnel junction structures 420 may be filled with a second interlayer insulating layer 425. The second interlayer insulating layer 425 may be formed by depositing an insulating material at a thickness enough to cover the magnetic tunnel junction structures 420 while filling the space between the magnetic tunnel junction structures 420, and performing a planarization process so that the upper surfaces of the magnetic tunnel junction structures 420 are exposed.

The plurality of electrode layers 430 may be arranged to overlap the plurality of magnetic tunnel junction structures 420, respectively. In particular, each electrode layer 430 may overlap at least a portion of a remaining portion of each magnetic tunnel junction structure 420. The remaining portion may include a portion that does not overlap the SOT line 410. Accordingly, the plurality of electrode layers 430 may be arranged in a matrix form along the first and second directions.

The electrode layer 430 may be formed in the following manner. As an example, the electrode layers 430 may be formed by depositing a conductive material over the magnetic tunnel junction structures 420 and the second interlayer insulating layer 425, and selectively etching the conductive material. As another example, the electrode layers 430 may be formed by depositing an insulating material (not shown) over the magnetic tunnel junction structures 420 and the second interlayer insulating layer 425, selectively etching the insulating material to form a hole exposing the remaining portion of the magnetic tunnel junction structure 420, and filling the hole with a conductive material.

One magnetic tunnel junction structure 420, one SOT line 410 connected thereto, and one electrode layer 430 connected thereto may form one memory cell. Accordingly, the semiconductor device implemented based on an embodiment may include a plurality of memory cells arranged in a matrix form along the first and second directions.

In an embodiment, the magnetic tunnel junction structure 420 has a pillar shape, and the plurality of magnetic tunnel junction structures 420 arranged in the second direction may be spaced apart from each other. However, the disclosed technology is not limited thereto. In another embodiment, the magnetic tunnel junction structure excluding the free layer may have a line shape extending in the second direction. When the free layers are separated from each other in the second direction, a plurality of memory cells may be formed, as will be discussed below with reference to FIGS. 7A to 7C.

Figure 7A:
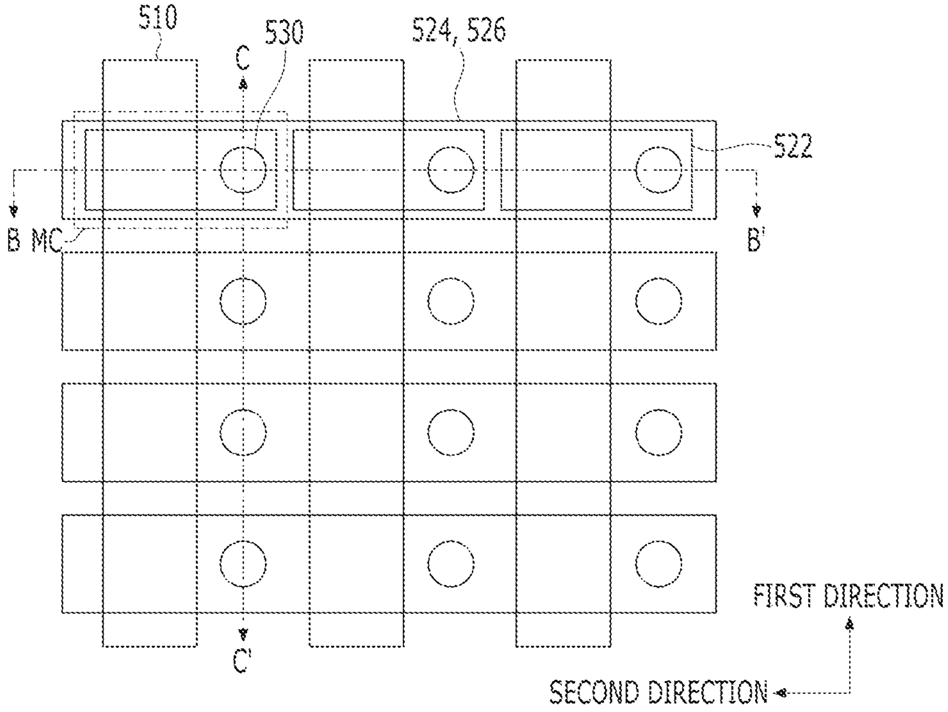
FIGS. 7A to 7C are views illustrating a semiconductor device based on some embodiments of the disclosed technology.
Figure 7B:
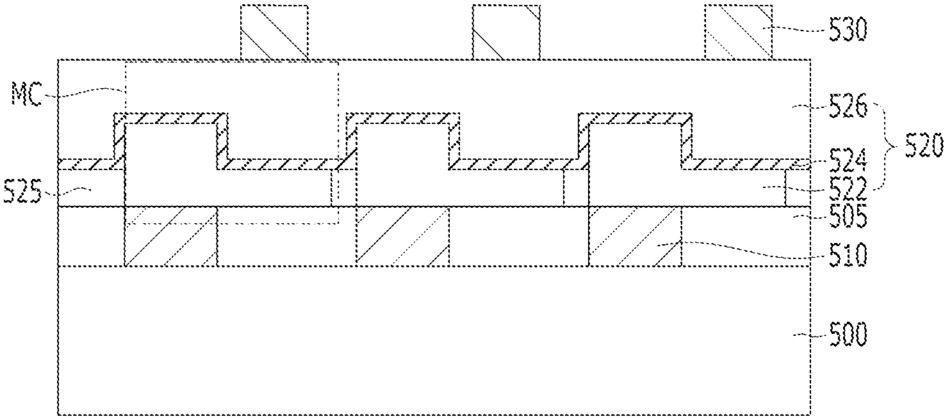
Figure 7C:
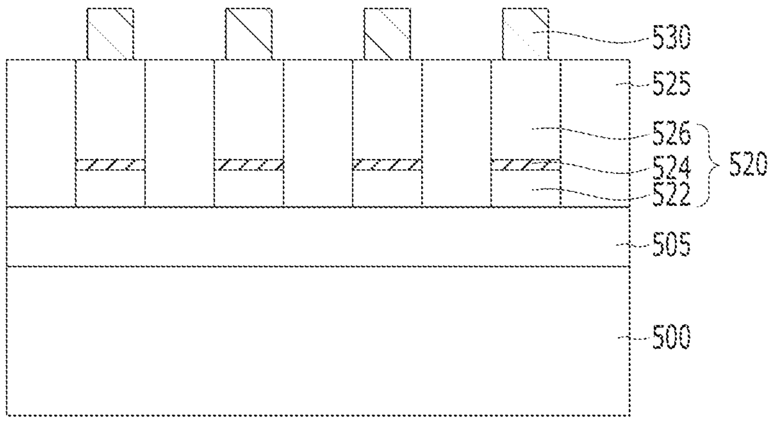

FIGS. 7A to 7C are views illustrating a semiconductor device based on some embodiments of the disclosed technology. FIG. 7A is a plan view, FIG. 7B is a cross-sectional view taken along a line B-B' of FIG. 7A, and FIG. 7C is a cross-sectional view taken along a line C-C' of FIG. 7A. The description will focus on differences from the semiconductor device of FIGS. 6A to 6C.

Referring to FIGS. 7A to 7C, a semiconductor device implemented based on an embodiment may include a substrate 500, a plurality of SOT lines 510 disposed over the substrate 500, a plurality magnetic tunnel junction structures 520 disposed over the plurality of SOT lines 510, and a plurality of electrode layers 530 disposed over the plurality of magnetic tunnel junction structures 520.

The plurality of SOT lines 510 may extend in the first direction over the substrate 500, and may be arranged to be spaced apart from each other in the second direction. The space between the plurality of SOT lines 510 may be filled with a first interlayer insulating layer 505.

The magnetic tunnel junction structure 520 may include a free layer 522, a tunnel barrier layer 524, and a pinned layer 526. In a plan view, the free layer 522 may have substantially the same shape and be arranged in the same manner as the free layer 422 of FIGS. 6A to 6C. That is, each free layer 522 may have a pillar shape, and a plurality of free layers 522 may be arranged in a matrix form along the first and second directions. On the other hand, except for the free layer 522 of the magnetic tunnel junction structure 520, the tunnel barrier layer 524 and the pinned layer 526 of the magnetic tunnel junction structure 520 may have a line shape extending in the second direction to cross the plurality of SOT lines 510 arranged in the second direction. The free layer 522 may include a portion that overlaps the SOT line 510 and a remaining portion that does not overlap the SOT line 510. Additionally, each of the pinned layer 524 and the tunnel barrier layer 526 may include a portion that overlaps the SOT line 510 and a remaining portion that does not overlap the SOT line 510. Here, the thickness of the portion of the free layer 522 that overlaps the SOT line 510 may be greater than the thickness of the remaining portion of the free layer 522 that does not overlap the SOT line 510. Additionally, the thickness of the portion of the pinned layer 526 that overlaps the SOT line 510 may be smaller than the thickness of the remaining portion of the pinned layer 526 that does not overlap the SOT line 510.

The magnetic tunnel junction structure 520 may be formed in the following manner. First, a first magnetic material for forming the free layer 522 may be deposited over the SOT lines 510 and the first interlayer insulating layer 505, the first magnetic material may be patterned into a pillar shape to form a first magnetic pattern, and a portion of the first magnetic pattern in an area that does not overlap the SOT line 510 may be selectively etched to a predetermined thickness to form the free layer 522. Here, a mask used for selective etching of the first magnetic pattern may have a shape that covers the area overlapping the SOT line 510 and exposes the remaining area. Subsequently, the space between the free layers 522 may be filled with an insulating material, and an insulating material for forming the tunnel barrier layer 524 may be deposited conformally along the lower profile over the free layers 522 and the insulating material. Subsequently, a second magnetic material for forming the pinned layer 526 may be deposited over the insulating material for forming the tunnel barrier layer 524, and a planarization process may be performed on the second magnetic material. Subsequently, the stacked structure of the insulating material for forming the tunnel barrier layer 524 and the second magnetic material may be selectively etched to have a line shape. Therefore, the stacked structure of the tunnel barrier layer 524 and the pinned layer 526 having a line shape may be formed, and accordingly, the magnetic tunnel junction structure 520 as shown may be formed. The space between the stacked structures of the tunnel barrier layers 524 and the pinned layers 526 may be filled with an insulating material. The insulating material that fills the space between the free layers 522, and the insulating material that fills the space between the stacked structures of the tunnel barrier layers 524 and the pinned layers 526 will be referred to as a second interlayer insulating layer 525.

The plurality of electrode layers 530 may be arranged to respectively overlap the remaining portions of the plurality of magnetic tunnel junction structures 520 that do not overlap the SOT lines 510. Accordingly, the plurality of electrode layers 530 may be arranged in a matrix form along the first and second directions.

One SOT line 510, one electrode layer 530, and a portion of the magnetic tunnel junction structure 520 therebetween may form one memory cell MC. Accordingly, the semiconductor device implemented based on an embodiment may include a plurality of memory cells MC arranged in a matrix form along the first and second directions.

As discussed above, the thickness of the pinned layer may be varied. However, in another embodiment, on the premise that the thickness of the free layer is variable, the thickness of the pinned layer may have a substantially constant value. For example, the deviation in thickness of the pinned layer may be within 10%. For example, the maximum thickness of the pinned layer may be 110% or less of the minimum thickness of the pinned layer while being greater than the minimum thickness of the pinned layer. This will be described exemplarily with reference to FIG. 8.

Figure 8:
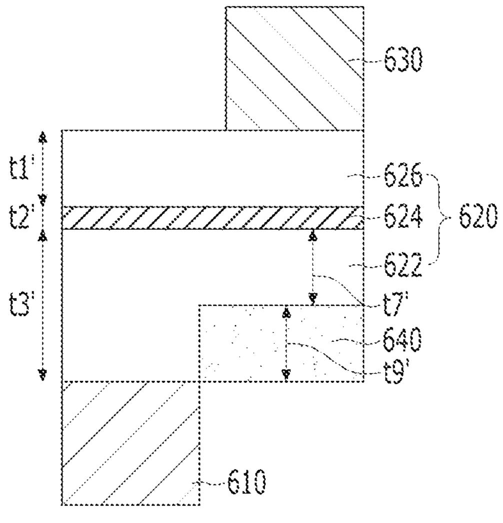
FIG. 8 is a cross-sectional view illustrating a semiconductor device based on some embodiments of the disclosed technology.

FIG. 8 is a cross-sectional view illustrating a semiconductor device based on some embodiments of the disclosed technology. The description will focus on the differences from the semiconductor device of FIGS. 1A and 1B.

Referring to FIG. 8, the semiconductor device of an embodiment may include an SOT line 610, a magnetic tunnel junction structure 520 including a free layer 622, a tunnel barrier layer 624, and a pinned layer 626, a magnetic loss layer 640, and an electrode layer 630.

Here, the thickness of the free layer 622 may not be constant, and may vary depending on its location. More specifically, the thickness t3' of the portion of the free layer 622 that overlaps the SOT line 610 may be greater than the thickness t7' of the remaining portion of the free layer 622 that does not overlap the SOT line 610. Unlike the examples illustrated in FIGS. 1A and 1B, the upper surface of the free layer 622 may be located at substantially the same height in the vertical direction, and in this case, the height of the lower surface of the free layer 622 may vary. That is, the height of the lower surface of the remaining portion of the free layer 622 may be greater than the height of the lower surface of the portion of the free layer 622.

The magnetic loss layer 640 may be disposed under the remaining portion of the free layer 622 to compensate for the height difference between the lower surfaces of the free layer 622. In other words, the thickness t3' of the portion of the free layer 622 that overlaps the SOT line 610 may be substantially equal to the sum of the thickness t7' of the remaining portion of the free layer 622 that does not overlap the SOT line 610 and the thicknesses t9' of the magnetic loss layer 640. As will be described later, the magnetic loss layer 640 may be formed by doping a portion of the magnetic material forming the free layer 622 with a dopant that causes magnetism to be lost, or by oxidizing a portion of the magnetic material. Accordingly, the magnetic loss layer 640 may be formed of a material containing the constituent elements of the free layer 622 and an element used as the dopant, or a material containing the constituent elements of the free layer 622 and oxygen. As an example, the dopant may be an inert element such as Ar.

Each of the thickness t2' of the tunnel barrier layer 624 and the thickness t1' of the pinned layer 626 may be substantially constant. Since the upper surface of the free layer 622 has a flat surface substantially parallel to the horizontal direction, each of the upper and lower surfaces of the tunnel barrier layer 624 may be substantially parallel to the horizontal direction while being located at substantially the same height, and each of the upper and lower surfaces of the pinned layer 626 may be substantially parallel to the horizontal direction while being located at substantially the same height.

As discussed above, one SOT line 610 may be connected to one magnetic tunnel junction structure 620 and one electrode layer 630, but the disclosed technology is not limited thereto. In another embodiment, similar to that described in FIGS. 6A to 6C and 7A to 7C, one SOT line may be connected to a plurality of magnetic tunnel junction structures and a plurality of electrode layers respectively corresponding to the plurality of magnetic tunnel junction structures, as will be discussed below with reference to FIG. 9.

Figure 9:
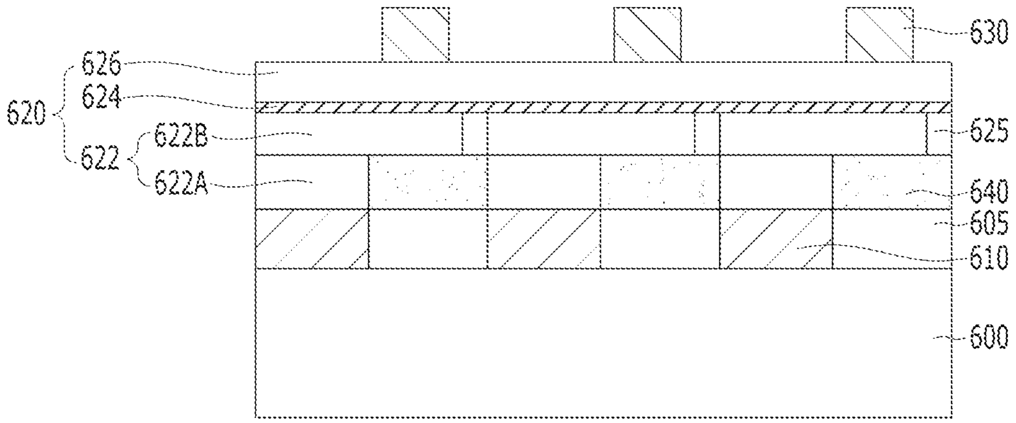
FIG. 9 is a view illustrating a semiconductor device based on some embodiments of the disclosed technology.

FIG. 9 is a view illustrating a semiconductor device based on some embodiments of the disclosed technology. The cross section in FIG. 9 may correspond to the cross section along the line B-B' in FIG. 7A.

Referring to FIG. 9, a semiconductor device of an embodiment may include a substrate 600, a plurality of SOT lines 610 disposed over the substrate 600, a plurality of magnetic tunnel junction structure 620 disposed over the plurality of SOT lines 610 and having a line shape, and a plurality of electrode layers 630 disposed over the magnetic tunnel junction structures 620.

The plurality of SOT lines 610 may extend in the first direction over the substrate 600, and may be arranged to be spaced apart from each other in the second direction. The space between the plurality of SOT lines 610 may be filled with a first interlayer insulating layer 605.

The magnetic tunnel junction structure 620 may include the free layer 622, the tunnel barrier layer 624, and the pinned layer 626. In a plan view, each free layer 622 has a pillar shape, and a plurality of free layers 622 may be arranged in a matrix form along the first and second directions. On the other hand, except for the free layer 622 of the magnetic tunnel junction structure 620, the tunnel barrier layer 624 and the pinned layer 626 may have a line shape extending in the second direction to cross the plurality of SOT lines 610 arranged in the second direction.

Here, in the area overlapping the SOT line 610, the free layer 622 may include a stacked structure of a first free layer 622A and a second free layer 622B. On the other hand, in the area that does not overlap the SOT line 610, the free layer 622 may include the second free layer 622B excluding the first free layer 622A. Accordingly, the thickness of the free layer 622 in the area overlapping the SOT line 610 may be greater than the thickness of the free layer 622 in the area not overlapping the SOT line 610. The magnetic loss layer 640 may be disposed under the second free layer 622B in an area that does not overlap the SOT line 610. The first free layer 622A and the second free layer 622B may include the same magnetic material, and thus, may form one lump. In the second direction, adjacent first free layers 622A may be separated from each other by the magnetic loss layer 640. Additionally, in the second direction, adjacent second free layers 622B may be separated from each other by a second interlayer insulating layer 625.

The magnetic tunnel junction structure 620 may be formed in the following manner. First, a first magnetic material for forming the first free layer 622A may be deposited over the SOT lines 610 and the first interlayer insulating layer 605, and the first magnetic material may be patterned into a pillar shape to form a first magnetic pattern. Subsequently, after forming a mask pattern that exposes the area that does not overlap the SOT line 610, a portion of the first magnetic pattern exposed by the mask pattern may be doped with a dopant that loses magnetism by ion implantation, or the portion of the first magnetic pattern exposed by the mask pattern may be oxidized, to form the first magnetic free layer 622A and the magnetic loss layer 530. Subsequently, a second magnetic material to form the second free layer 622B may be deposited, and the second magnetic material may be patterned into a pillar shape to form a second magnetic pattern. The space between the second magnetic patterns may be filled with an insulating material. Subsequently, an insulating material for forming the tunnel barrier layer 624 may be deposited over the second magnetic pattern and the insulating material. Subsequently, a third magnetic material for forming the pinned layer 626 may be deposited over the insulating material for forming the tunnel barrier layer 624. Subsequently, the stacked structure of the insulating material for forming the tunnel barrier layer 624 and the third magnetic material may be selectively etched to have a line shape. As a result, the magnetic tunnel junction structure 620 as shown may be formed. For reference, in another embodiment, the entire magnetic tunnel junction structure 620 may have a pillar shape instead of a line shape. In this case, selective etching may be performed on the stacked structure of the insulating material for forming the tunnel barrier layer 624 and the third magnetic material so that it has a pillar shape instead of a line shape.

The plurality of electrode layers 630 may be arranged to respectively overlap the remaining portions of the magnetic tunnel junction structures 620 that do not overlap the SOT line 610.

Figure 10:
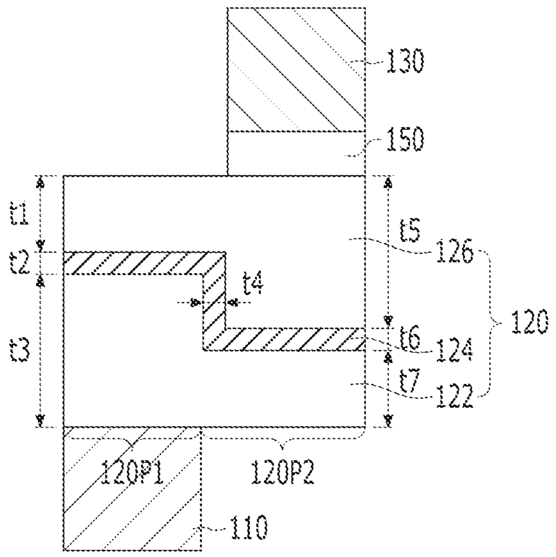
FIG. 10 is a cross-sectional view illustrating a semiconductor device based on some embodiments of the disclosed technology.

FIG. 10 is a cross-sectional view illustrating a semiconductor device based on some embodiments of the disclosed technology. The description will focus on the differences from the semiconductor device of FIGS. 1A and 1B.

Referring to FIG. 10, a semiconductor device of an embodiment may include an SOT line 110, a magnetic tunnel junction structure 120 including a free layer 122, a tunnel barrier layer 124, and a pinned layer 126, an electrode layer 130, and a selector layer 150. That is, the semiconductor device of an embodiment may further include the selector layer 150 compared to the semiconductor device of FIGS. 1A and 1B.

The selector layer 150 may have a pillar shape that is interposed between the electrode layer 130 and the magnetic tunnel junction structure 120 and overlaps the electrode layer 130. In an embodiment, the selector layer 150 may be patterned together with the electrode layer 130 to have the same planar shape as the electrode layer 130. That is, the sidewall of the selector layer 150 may be aligned with the sidewall of the electrode layer 130. However, the disclosed technology is not limited thereto, and the selector layer 150 may have a different planar shape and/or planar area than the electrode layer 130, provided that the selector layer 150 overlaps the electrode layer 130.

The selector layer 150 may control access to the magnetic tunnel junction structure 120, and may function to prevent and/or reduce current leakage that occurs between the magnetic tunnel junction structures 120 sharing the SOT line 110 or another conductive line (not shown). To this end, the selector layer 150 may have a threshold switching characteristic that blocks current or hardly flows current when the magnitude of the voltage supplied to its top and bottom is less than a predetermined threshold voltage, and allow current to flow rapidly above this threshold voltage. That is, the selector layer 150 may be turned on at the threshold voltage or higher and turned off below the threshold voltage.

The selector layer 150 may include a diode, an ovonic threshold switching (OTS) material such as a chalcogenide-based material, a mixed ionic electronic conducting (MIEC) material such as a metal-containing chalcogenide-based material, a metal insulator transition (MIT) material such as $NbO_2$ and $VO_2$, or a tunneling insulating material with a relatively wide band gap, such as $SiO_2$ and $Al_2O_3$.

Alternatively, the selector layer 150 may include an insulating material layer doped with a dopant. Here, the insulating material layer may include a silicon-containing insulating material such as silicon oxide, silicon nitride, and silicon oxynitride, an insulating metal oxide, an insulating metal nitride, or a combination thereof. There may be a deep trap within the insulating material layer having an energy level closer to the energy level of the valence band than the energy level of the conduction band of the insulating material layer. The dopant may serve to create a shallow trap that provides a path for the movement of conductive carriers, such as electrons or holes, within the insulating material layer. The shallow trap may have an energy level that is closer to the energy level of the conduction band than to the energy level of the valence band of the insulating material layer. As an example, when the insulating material layer contains silicon, the dopant may be a metal with a different valence than silicon, such as gallium (Ga), boron (B), indium (In), phosphorus (P), arsenic (As), antimony. (Sb), germanium (Ge), carbon (C), tungsten (W), or a combination thereof. Alternatively, when the insulating material layer contains a metal, the dopant may include another metal having a different valence than the metal, or silicon. As an example, the selector layer 150 may include arsenic (As) doped silicon oxide, such as silicon dioxide ($SiO_2$). When a voltage higher than the threshold voltage is applied to the selector layer 150, carriers trapped in the deep trap may jump to the shallow trap by thermal emission or tunneling, and the carriers may be transferred through the shallow trap, thereby implementing an on state in which current flows through the selector layer 150. On the other hand, when no voltage is applied to the selector layer 150 or a voltage less than the threshold voltage is applied, the phenomenon of the carriers jumping into shallow trap may be reduced or prevented, resulting in an off state in which no current flows through the selector layer 150.

As discussed above, in some embodiments of the disclosed technology, a semiconductor device may perform high-speed and low-power operation and ensure thermal stability.

Although various embodiments have been described for illustrative purposes, it should be understood that modifications to the disclosed embodiments and other embodiments may be made based on what is described and/or illustrated in this patent document.

What is claimed is:

1. A semiconductor device comprising:

one or more first conductive lines extending in a first direction to carry a current through the one or more first conductive lines;

one or more electrode layers, each electrode layer spaced apart from a corresponding first conductive line in a third direction crossing the first direction; and one or more magnetic tunnel junction structures, each magnetic tunnel junction structure interposed between a corresponding first conductive line and a corresponding electrode layer, each of the one or more magnetic tunnel junction structures including a free layer, a pinned layer, and a tunnel barrier layer stacked in the third direction, the free layer disposed adjacent to the corresponding first conductive line, the pinned layer disposed adjacent to the corresponding electrode layer, the tunnel barrier layer interposed between the free layer and the pinned layer, wherein each of the one or more magnetic tunnel junction structures includes a first portion that overlaps the corresponding first conductive line and a second portion that does not overlap the corresponding first conductive line, each magnetic tunnel junction structure extending in a second direction crossing the first and third directions, the corresponding electrode layer overlaps at least partially the second portion of a corresponding magnetic tunnel junction structure, and a thickness of the free layer in the first portion is greater than a thickness of the free layer in the second portion of the corresponding magnetic tunnel junction structure.

2. The semiconductor device according to claim 1, wherein a resistance state of each magnetic tunnel junction structure is switched by: a spin orbit torque (SOT) method that switches the resistance state of each magnetic tunnel junction structure using a current flowing through the corresponding first conductive line; and a spin transfer torque (STT) method that switches the resistance state of each magnetic tunnel junction structure using a current flowing through each magnetic tunnel junction structure from the corresponding electrode layer.

3. The semiconductor device according to claim 1, wherein each of the corresponding magnetic tunnel junction structure and the corresponding electrode layer has a pillar shape.

4. The semiconductor device according to claim 3, wherein a length of the corresponding magnetic tunnel junction structure in the first direction is smaller than a length in the second direction.

5. The semiconductor device according to claim 1, wherein the pinned layer of the corresponding magnetic tunnel junction structure has a line shape extending in the second direction, and each of the free layer of the corresponding magnetic tunnel junction structure and the corresponding electrode layer has a pillar shape.

6. The semiconductor device according to claim 1, wherein the one or more first conductive lines include a plurality of first conductive lines arranged in the second direction, and the corresponding magnetic tunnel junction structure and the corresponding electrode layer are connected to one of the plurality of first conductive lines.

7. The semiconductor device according to claim 1, wherein the one or more first conductive lines include a plurality of first conductive lines arranged in the second direction, the one or more magnetic tunnel junction structures include a plurality of magnetic tunnel junction structures arranged to be spaced apart from each other in the first direction and respectively connected to the plurality of first conductive lines, and the one or more electrode layers include a plurality of electrode layers respectively connected to the plurality of magnetic tunnel junction structures.

8. The semiconductor device according to claim 1, wherein each magnetic tunnel junction structure further includes: an additional pinned layer interposed between the pinned layer and the corresponding electrode layer and anti-ferromagnetically coupled to the pinned layer; and a non-magnetic material layer interposed between the additional pinned layer and the pinned layer.

9. The semiconductor device according to claim 1, further comprising:

a magnetic loss layer in contact with the free layer in the second portion of each magnetic tunnel junction structure, in the third direction.

10. The semiconductor device according to claim 9, wherein the magnetic loss layer includes at least one of: a constituent element of the free layer; an element that causes loss of a magnetic property of the free layer, or oxygen.

11. The semiconductor device according to claim 9, wherein a thickness of the free layer in the first portion of each magnetic tunnel junction structure is equal to a sum of a thickness of the free layer in the second portion of each magnetic tunnel junction structure and a thickness of the magnetic loss layer.

12. The semiconductor device according to claim 1, further comprising:

one or more selector layers, each selector layer interposed between a corresponding pinned layer and a corresponding electrode layer.

13. The semiconductor device according to claim 1, a sum of a thickness of the pinned layer in the first portion of each magnetic tunnel junction structure is smaller than a thickness of the pinned layer in the second portion of each magnetic tunnel junction structure.

14. The semiconductor device according to claim 13, wherein a sum of a thickness of the free layer, a thickness of the tunnel barrier layer, a thickness of the pinned layer in the first portion of each magnetic tunnel junction structure is equal to a sum of a thickness of the free layer, a thickness of the tunnel barrier layer, and a thickness of the pinned layer in the second portion of each magnetic tunnel junction structure.

15. The semiconductor device according to claim 1, wherein a thickness of the pinned layer in the first portion of each magnetic tunnel junction structure is equal to a thickness of the pinned layer in the second portion of each magnetic tunnel junction structure.

16. The semiconductor device according to claim 1, wherein each of the free layer and the pinned layer has a magnetization direction parallel to the third direction.

17. The semiconductor device according to claim 1, wherein the free layer includes a first surface facing the pinned layer, and the pinned layer includes a second surface facing the free layer, wherein the first surface and the second surface in each of the first portion and the second portion of each magnetic tunnel junction structure are parallel to a plane formed by an axis corresponding to the first direction and another axis corresponding to the second direction, and at a boundary between the first portion and the second portion of each magnetic tunnel junction structure, the first surface and the second surface are parallel to the third direction.

18. The semiconductor device according to claim 17, wherein the tunnel barrier layer includes a third surface facing the first surface or the second surface, wherein the third surface in each of the first portion and the second portion is parallel to the plane, and at the boundary between the first portion and the second portion of each magnetic tunnel junction structure, the third surface is parallel to the third direction.

19. The semiconductor device according to claim 1, wherein the free layer includes a first surface located opposite to a surface facing the pinned layer, and the pinned layer has a second surface facing the free layer, wherein the first surface in each of the first portion and the second portion of each magnetic tunnel junction structure is parallel to a plane formed by an axis corresponding to the first direction and another axis corresponding to the second direction, and the first surface at a boundary between the first portion and the second portion is parallel to the third direction, and the second surface is parallel to the plane.

20. The semiconductor device according to claim 19, wherein the tunnel barrier layer has a third surface facing the second surface, and the third surface is parallel to the plane.

* * * * *